US008211719B2

(12) United States Patent
Morimoto et al.

(10) Patent No.: US 8,211,719 B2
(45) Date of Patent: Jul. 3, 2012

(54) METHOD OF PROCESSING SUBSTRATE AND METHOD OF MANUFACTURING SUBSTRATE FOR USE IN LIQUID EJECTION HEAD

(75) Inventors: Hiroyuki Morimoto, Tokyo (JP); Masahiko Kubota, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 105 days.

(21) Appl. No.: 12/885,257

(22) Filed: Sep. 17, 2010

(65) Prior Publication Data

US 2011/0070667 A1 Mar. 24, 2011

(30) Foreign Application Priority Data

Sep. 24, 2009 (JP) ................................ 2009-218924

(51) Int. Cl.
*H01L 21/66* (2006.01)

(52) U.S. Cl. ............ 438/16; 438/14; 438/487; 438/940; 257/E21.028; 257/E21.134; 257/E21.17; 257/E21.34; 430/311; 430/320; 430/330

(58) Field of Classification Search .................... 438/14, 438/16, 940; 257/E21.028, E21.134, E21.17, 257/E21.34, E21.475, E21.517, E21.529; 430/311, 320, 322, 326, 330; 216/27
See application file for complete search history.

(56) References Cited

U.S. PATENT DOCUMENTS

| | | | | |
|---|---|---|---|---|
| 5,478,606 | A | 12/1995 | Ohkuma | |
| 2003/0146955 | A1 | 8/2003 | Imamura | |
| 2004/0084404 | A1 | 5/2004 | Donaldson | |
| 2009/0194516 | A1* | 8/2009 | Deshi | 219/121.71 |

FOREIGN PATENT DOCUMENTS

| | | | |
|---|---|---|---|
| JP | 2000-326515 | A | 11/2000 |
| JP | 3143307 | B2 | 3/2001 |
| JP | 2002-176240 | A | 6/2002 |
| JP | 2004-148824 | A | 5/2004 |

OTHER PUBLICATIONS

D.K. Hamilton et al, "Three-Dimentional Surface Measurement Using the Confocal Scanning Microscope", Applied Physics B 27, 211-213, 1982.

Masayoshi Kamiya, et al., Journal of Japan Laser Processing Society vol. 66, "Real-Time Measurement of Processed Hole Depth on Femtosecond Laser Processing", 97-102.

* cited by examiner

*Primary Examiner* — Hsien Ming Lee
*Assistant Examiner* — Walter H Swanson
(74) *Attorney, Agent, or Firm* — Canon U.S.A., Inc., IP Division

(57) ABSTRACT

A substrate processing method includes preparing a substrate, a first mask adjacent to a first surface of the substrate and including a first light transmitting portion allowing light to be transmitted therethrough, a condenser adjacent to the first surface, a second mask including a second light transmitting portion, and a photo detecting member including a photo detecting portion detecting light having passed through the second light transmitting portion, the condenser condensing light having passed through the first light transmitting portion toward the second light transmitting portion, the second light transmitting portion allowing the light condensed by the condenser to be transmitted therethrough, and forming a recess in the substrate by laser beam irradiation from a direction opposite to the first surface. When an intensity of the laser beam detected by the photo detecting portion is at or above a specific intensity, the irradiation of the laser beam is stopped.

12 Claims, 9 Drawing Sheets

METHOD OF PROCESSING SUBSTRATE AND METHOD OF MANUFACTURING SUBSTRATE FOR USE IN LIQUID EJECTION HEAD

BACKGROUND OF THE INVENTION

1. Field of the Invention

The present invention relates to a method of processing a silicon substrate and a method of manufacturing a substrate for use in a liquid ejection head.

2. Description of the Related Art

Japanese Patent Laid-Open No. 2004-148824 describes a method of forming a fluid supply slot of a print head. With the method described in this patent document, first, laser processing or dry etching processing is performed from a back surface of a substrate in which a print head is to be formed, and then wet etching is conducted to a front surface of the substrate to penetrate the substrate. This processing method can reduce the width of a formed fluid supply slot to a minimum size. Accordingly, the number of print heads obtainable in the same wafer can be increased, thus resulting in a cost reduction of print heads.

Japanese Patent Laid-Open No. 2002-176240 describes a method of detecting the progress of laser processing and stopping the processing. With the method described in this patent document, aside from a processing pulse laser beam, a measurement laser beam is used, and a reflection light beam when a laser beam is focused on each of a surface of an insulating resin layer and a surface of a copper layer within a via hole is detected. By the use of the difference between the times when the strengths of the reflection light beams reach their respective peaks, the thickness from the bottom surface of the via hole and the surface of the copper layer is measured. When the measurement value is at or below a specific value, processing using the processing pulse laser beam is stopped. The measurement unit described in this patent document is the technique known as "confocal microscope."

The confocal microscope is also discussed in "Three-dimensional surface measurement using the confocal scanning microscope," Applied Physics B 27, pp. 211-213 (1982), Hamilton and Wilson, for example.

Another example unit configured to detect the progress of laser processing is a measurement unit using a femtosecond laser introduced by Aoshima et al. in Proceedings of the 66th Laser Materials Processing Conference of Japan Laser Processing Society.

However, the above-described examples have drawbacks described below.

For laser processing on a slot illustrated in Japanese Patent Laid-Open No. 2004-148824, high-precision control on the depth of the laser processing is a technical issue. Traditionally, the depth of laser processing is set by the time of laser irradiation or the number of pulses. At a processing initial stage where the depth of laser processing is shallow, a relationship between the laser irradiation time or the number of pulses and the depth of processing shows a linearly increasing tendency. However, as the processing continues to progress and the "aspect ratio" defined by the depth-to-width ratio of a slot increases, the linearly increasing tendency is reducing and the depth of processing at the processing surface of a slot section varies. However, because wet etching uniformly dissolves the entire substrate, if a plurality of pilot holes formed in the substrate by laser processing have widely different depths, for example, the slot shape after wet etching largely varies. These variations in the slot shape cause variations in flow resistance of fluid supplied in the slot. As a result, the product performance may greatly vary.

Examples of a unit configured to reduce variations in the depth of laser processing include an apparatus proposed in the above-mentioned Japanese Patent Laid-Open No. 2002-176240 and a measurement unit using a femtosecond laser proposed by Aoshima et al., which is mentioned above. However, for these examples, the direction of incidence of a laser beam and the direction of measurement of the depth of processing are the same (at the same side). Accordingly, the precision of measurement of the depth of laser processing is a problem. For typical processing using pulsed laser light, with laser irradiation, a high-temperature high-density ionized region (hereinafter also referred to as "plume") or a particulate workpiece material (hereinafter also referred to as "debris") occurs. Therefore, if laser processing and measurement are simultaneously performed at the same side, measurement light may be continuously affected by reflection or refraction resulting from the plume or debris, and the precision of measurement may decrease. Additionally, in order to enlarge a laser processing area, it is necessary to reduce magnification of condensation of light of an optical system, but such a reduction may also reduce magnification of measurement and decrease the precision of measurement.

SUMMARY OF THE INVENTION

The present invention provides a method of detecting a position of a work region processed by laser processing accurately and processing a substrate with enhanced yield and high precision.

According to an aspect of the present invention, a method of processing a substrate includes preparing a substrate, a first mask disposed adjacent to a first surface of the substrate, a condenser disposed adjacent to the first surface of the substrate, a second mask including a second light transmitting portion, and a photo detecting member including a photo detecting portion, the first mask including a first light transmitting portion that allows light to be transmitted therethrough, the condenser being configured to condense light that has passed through the first light transmitting portion toward the second light transmitting portion, the second light transmitting portion allowing the light condensed by the condenser to be transmitted therethrough, the photo detecting portion being configured to detect light that has passed through the second light transmitting portion, and forming a recess in the substrate by irradiation of a laser beam from a direction opposite to the first surface of the substrate. The laser beam is detected by the photo detecting portion, and when an intensity of the laser beam detected by the photo detecting portion is equal to or larger than a specific intensity, the irradiation of the laser beam is stopped.

With one aspect of the present invention, a method of detecting a position of a work region processed by laser processing accurately and thus processing a substrate with enhanced yield and high precision can be provided.

Further features of the present invention will become apparent from the following description of exemplary embodiments with reference to the attached drawings.

DESCRIPTION OF THE EMBODIMENTS

The embodiments of the present invention are described below with reference to the drawings. In the following description, a substrate for use in a liquid ejection head is employed as one example of a substrate, a method of manufacturing a liquid ejection head is described, and an embodiment in which a substrate for use in a liquid ejection head is manufactured in a process of manufacturing the liquid ejection head is described. However, the present invention is not limited to that embodiment and is also applicable to a method of manufacturing various substrates, including a semiconductor substrate.

According to an embodiment of the present invention, a method of manufacturing a liquid ejection head includes irradiating a substrate including a resin layer in which an ejection orifice through which droplets are ejected to a surface and a liquid channel linked to the ejection orifice are to be formed with a laser beam from the back side of the substrate to form a pilot hole, performing anisotropic etching after the pilot hole is formed, and forming a liquid supply port linked to the channel. Detecting a laser beam that has passed through a substrate and a resin layer by a confocal microscope adjacent to the front surface of the substrate in forming a pilot hole enables the depth of laser processing in the pilot hole to be detected.

With the configuration of embodiments of the present invention, a pilot hole can be formed with high precision while being adjusted to a specific depth.

In particular, forming a pilot hole at a maximum depth can minimize the thickness of a remaining substrate and can shorten the time required for wet etching performed thereafter.

System Configuration

Figure 1:
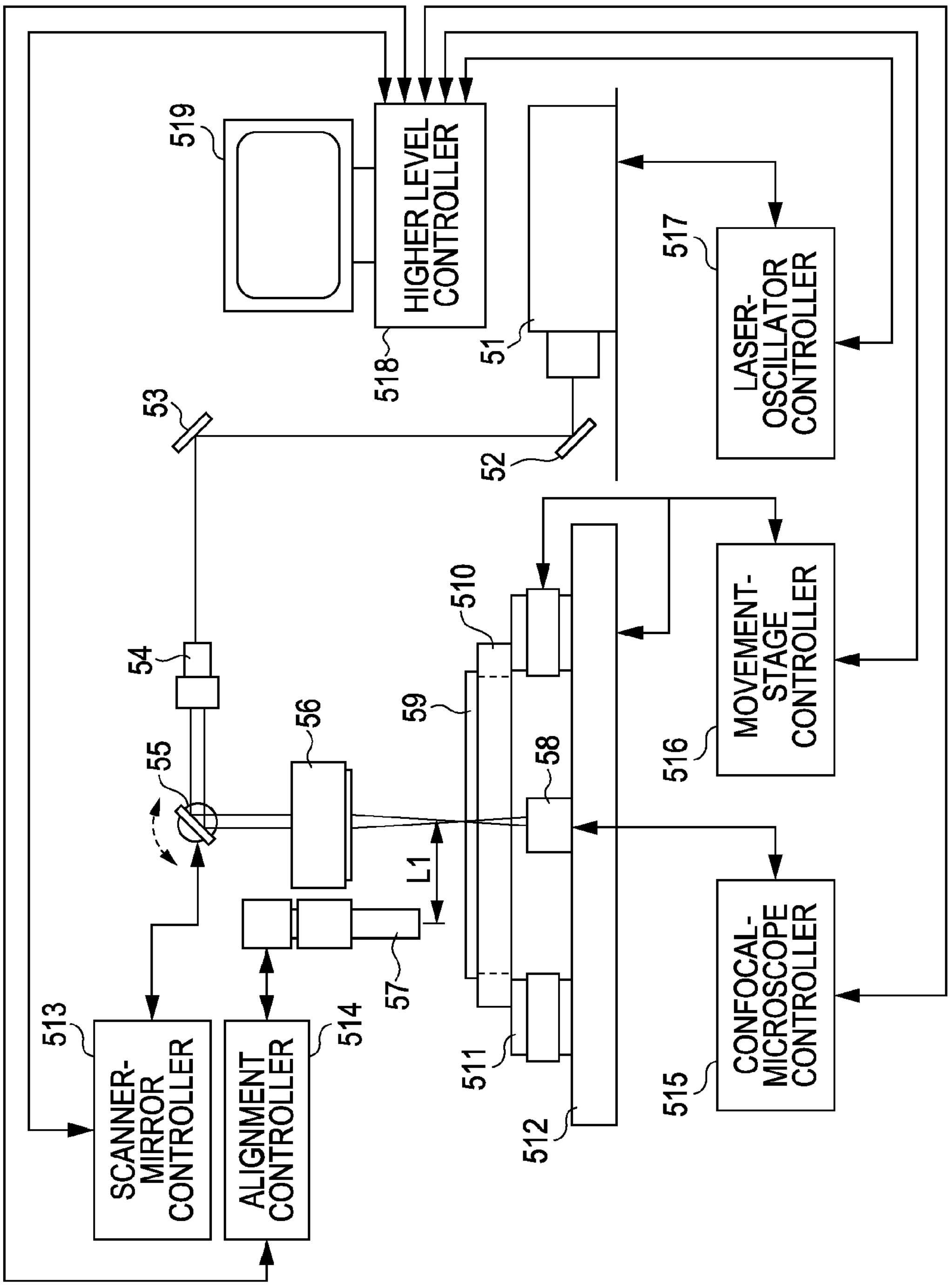
FIG. 1 is a schematic diagram that illustrates one example system configuration according to an embodiment of the present invention.

FIG. 1 is a schematic diagram that illustrates one example system configuration according to an embodiment of the present invention. In FIG. 1, reference numeral 59 indicates a substrate and a resin layer including an ejection energy generating element. Reference numeral 51 indicates a laser oscillator. A first reflector 52 and a second reflector 53 reflect a laser beam. A beam expander 54 increases the outer diameter of a laser beam. A scanner mirror 55 reflects a laser beam at a desired angle. A condenser 56 condenses a laser beam reflected at the scanner mirror 55 on a substrate. An alignment microscope 57 is disposed to identify an alignment mark formed on a substrate. A confocal microscope 58 is configured to receive a laser beam that has passed through the substrate and resin layer and detect a laser processing position. A fixing jig 510 is configured to fix a substrate on a movement stage. A first movement stage 511 is configured to move a substrate and the jig 510 in a direction substantially perpendicular to the drawing. A second movement stage 512 is configured to move a substrate, the jig 510, and the first movement stage 511 in a direction substantially parallel to the drawing. A scanner-mirror controller 513 controls operation of the scanner mirror 55. An alignment controller 514 controls operation of the alignment microscope 57. A confocal-microscope controller 515 controls operation of the confocal microscope 58 and performs processing for a signal output from the confocal microscope 58. A movement-stage controller 516 controls operation of each of the first movement stage 511 and the second movement stage 512. A laser-oscillator controller 517 controls operation of the laser oscillator 51. A higher level controller 518 exercises control over each of the controllers 515, 516, and 517. A user interface 519 is used in inputting an operating program into the higher level controller 518.

One example of the substrate can be a silicon substrate. The resin layer is disposed on the substrate. An ink channel and an ink ejection orifice are to be formed on the resin layer. In FIG. 1, the substrate is arranged above the resin layer.

Operations in the above system configuration are described below in sequence. First, the position of the substrate is adjusted using the first movement stage 511 and the second movement stage 512. The alignment mark formed on the substrate is identified by the alignment microscope 57. Each of the first movement stage 511 and the second movement stage 512 obtains position information using a unit for detecting the amount of displacement, such as an interferometer or a linear encoder, provided to the stage itself. The distance L1 between the alignment microscope 57 and the optical axis of the condenser 56 is known. The positional relationship between the substrate and the optical axis of the condenser 56 can be calculated by use of the stage position information and the above distance L1, and the substrate can be aligned at a desired position.

Then, in response to a driving signal from the laser-oscillator controller 517, the laser oscillator 51 emits a laser beam.

The laser beam used here has sufficient power to form a pilot hole in the substrate and has high peak power caused by pulse oscillation. The wavelength of oscillation is selected so as to partially penetrate through the substrate; for example, it can be 1,064 nm emitted from a $Nd{:}YVO_4$ laser crystal.

The pilot hole is not particularly limited. For example, it can have the shape of a hole with a substantially circular cross section or a slit. For a hole shape with a substantially circular cross section, its diameter can be $\phi$ approximately 5 to approximately 100 μm, for example. For a slit shape, it can be formed by laser beam scanning.

A laser beam emitted by the laser oscillator 51 is reflected by the first reflector 52 and the second reflector 53 to an appropriate direction. The reflected beam enters the beam expander 54, and the outer diameter of the laser beam is enlarged at a desired magnification. The laser beam with an angle of reflection modulated by the scanner mirror 55 is condensed on the substrate by the condenser 56 while at the same time being moved on the substrate with a high speed, thereby performing laser processing with a desired dimension. The laser processing forms a hole or slit, for example, as a pilot hole in the substrate. Here, part of the laser beam passes through the substrate and the resin layer and enters the confocal microscope 58. The incident laser beam is converted into an electric signal. As a result of signal processing by the confocal-microscope controller 515, position information on a laser processing surface (information on a laser processing surface) in the pilot hole is obtained. When the laser processing surface reaches a preset position, the higher level controller 518 can stop laser oscillation to stop the processing.

In FIG. 1, the single scanner mirror 55 modulates a reflection direction into a direction substantially parallel to the drawing. The addition of a second scanner mirror for modulating a reflection direction to a direction substantially perpendicular to the drawing downstream of the scanner mirror 55 enables the focal point to be two-dimensionally moved in scanning on the substrate.

In FIG. 1, the condenser 56 is located after the scanner mirror 55. If the condenser 56 is disposed before the scanner mirror 55 and the position of the condenser 56 is modulated toward the direction of the optical axis in synchronization with the modulation by the scanner mirror 55, the focal point can be three-dimensionally moved in scanning.

Confocal Microscope

Figure 2:
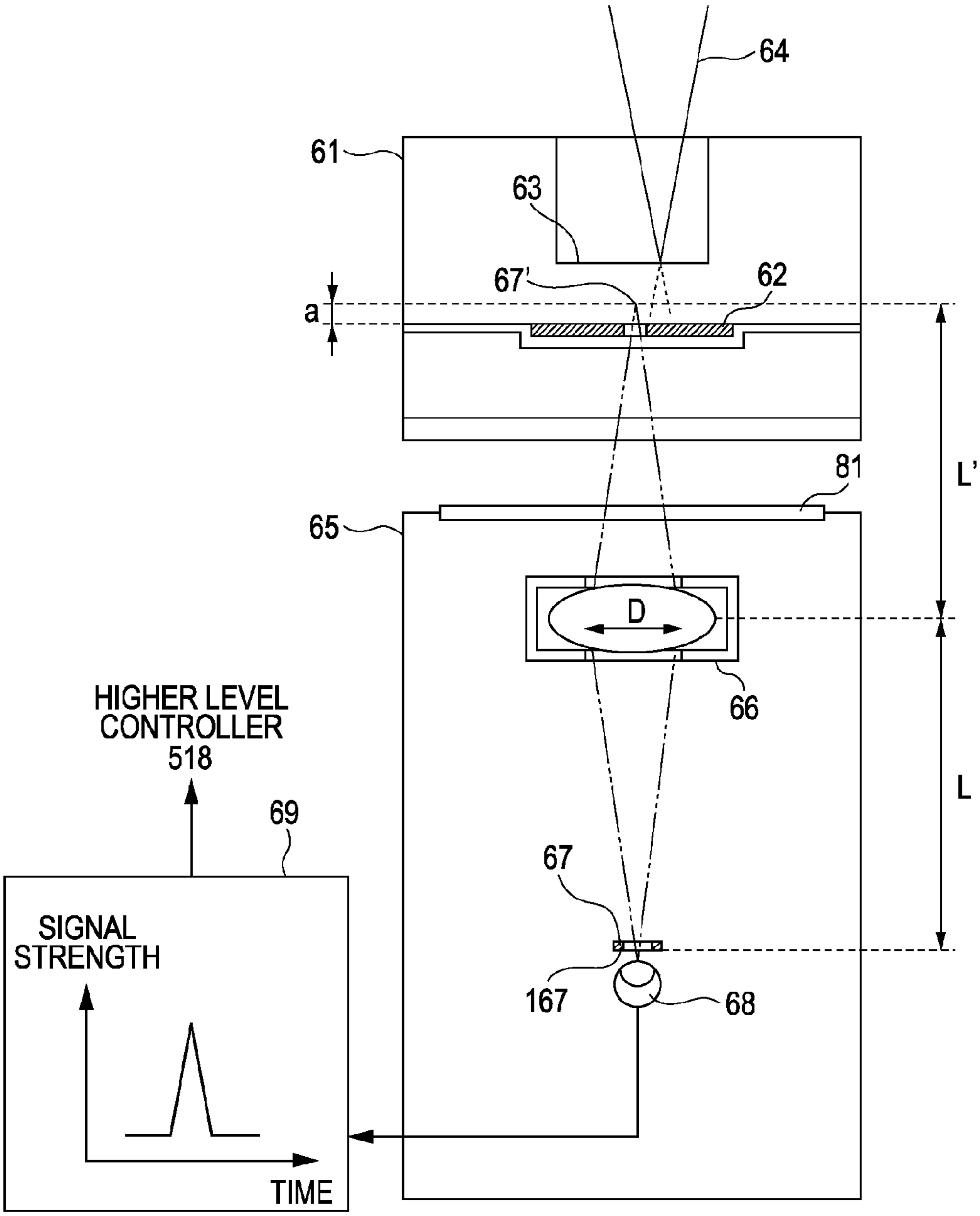
FIG. 2 is a schematic diagram for use in describing basic operating principles of a confocal microscope according to an embodiment of the present invention.

FIG. 2 illustrates basic operating principles of a confocal microscope according to an embodiment of the present invention. A substrate 61 for use in an ink jet recording head includes an ejection energy generating element. A resin layer including an adhesion enhancing layer and a channel forming layer is disposed on the front surface of (in FIG. 2, corresponding to on the lower part of) the substrate 61. A sacrificial layer 62 is a first mask having a first light transmitting portion. The light transmitting portion may have the shape of an opening. To describe basic operation of the confocal microscope according to an embodiment of the present invention, an example in which the sacrificial layer is disposed on the front surface of the substrate is provided. Although no sacrificial layer may be provided in the present invention, it is useful that a sacrificial layer exist in terms of accurate formation of a liquid supply port. The sacrificial layer may have no opening as long as the sacrificial layer allows a laser beam to be transmitted therethrough. A forefront surface (also referred to as laser processing surface) 63 of a pilot hole having the shape of a hole or a slit formed in the substrate 61 by a laser beam. A laser beam 64 has a wavelength that partially passes through the substrate 61. A condenser 66 is arranged within a confocal microscope 65. A second mask 167 is arranged within the confocal microscope 65 and has a pinhole 67 as a second light transmitting portion. A photodetector 68 is arranged within the confocal microscope 65. Reference numeral 69 indicates a signal processing device. A transparent window 81 is transparent to the laser beam 64.

When the focal length of the condenser is f and the distance between the condenser and the pinhole is L, the pinhole forms an optically conjugate image 67' at a distance L' from the condenser at an opposite side to the pinhole, and its relational expression is $1/L'=1/L+1/f$. Laser processing is advanced by the laser beam 64 moving on the laser processing surface 63 with a high speed. Part of the laser beam passes through the opening in the substrate and the sacrificial layer. The part of the laser beam is diffused in a direction opposite to an incidence side (in a direction to the front surface of the substrate). The diffused light is condensed by the condenser 66. With the progress of laser processing, at the point in time when the laser processing surface 63 and the position of the conjugate image 67' match each other, the intensity of light passing through the center of the pinhole is at a maximum. In other words, when the intensity of a laser beam passing through the pinhole 67 is at a maximum, the laser processing surface is at the position of the distance L'. Accordingly, detecting the time when an electric signal from the photodetector 68 is at a maximum by the signal processing device 69 and stopping the laser oscillator can stop laser processing at the position of the distance L' with high precision.

Figure 3:
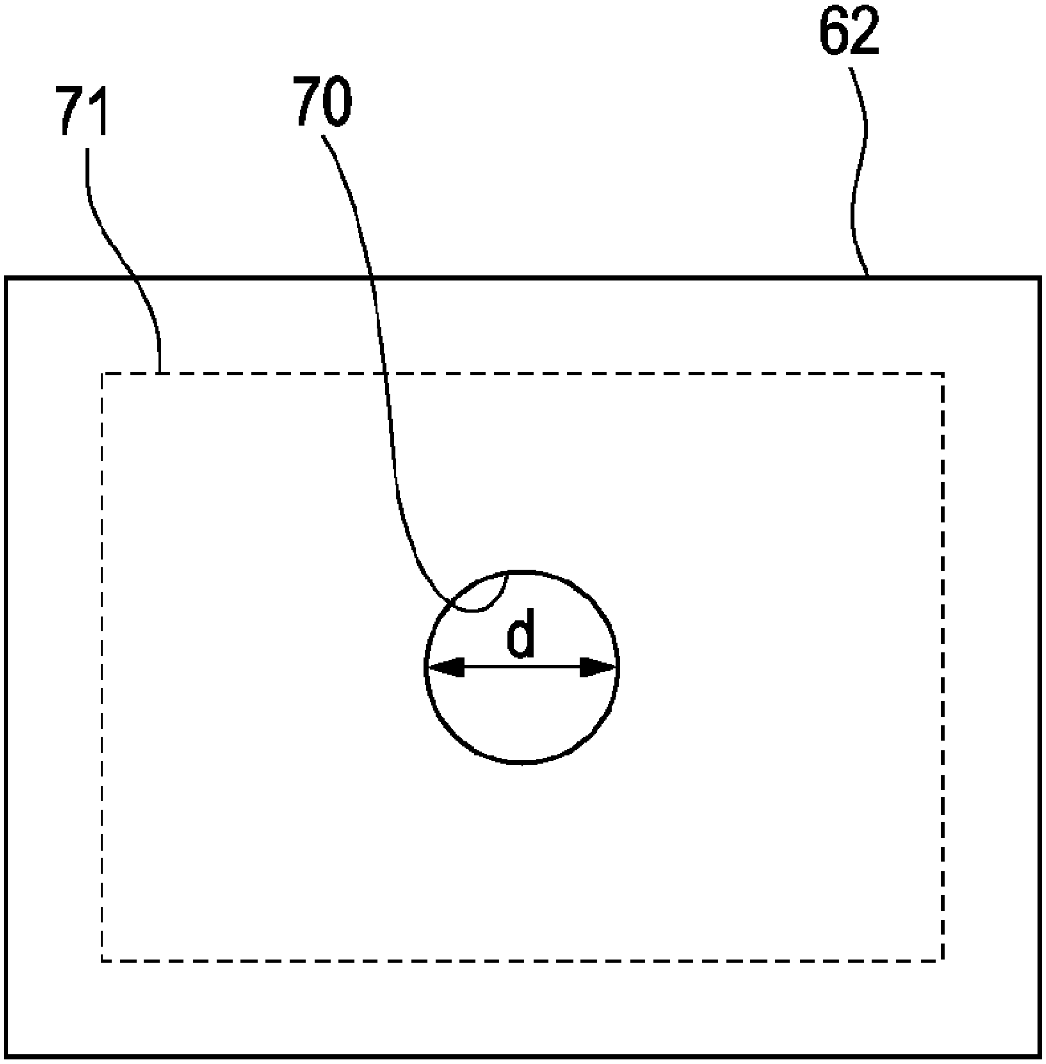
FIG. 3 is a schematic top view of a sacrificial layer having an opening.

FIG. 3 is a schematic top view of the sacrificial layer having an opening. An opening 70 is disposed within a range of laser processing region in the sacrificial layer and has the diameter d. A method of forming an opening in a sacrificial layer is not particularly limited, and typical photolithography can be used. An outline 71 indicates one example outline of the laser processing region. Example dimensions illustrated in FIG. 3 are as follows: the length of the vertical side of the sacrificial layer 62 is approximately 100 μm, the length of the vertical side of the laser processing region is approximately 80 μm, and the diameter d is approximately 20 μm.

It is useful that the center of the opening of the sacrificial layer be arranged on the optical axis linking the center of the pinhole and the center of the optically conjugate image of the pinhole formed inside the substrate through the condenser. That is, it is useful that the opening of the sacrificial layer be disposed such that the center of that opening is arranged on the optical axis linking the center of the pinhole in the confocal microscope and the center of the optically conjugate image of the pinhole formed inside the substrate through the condenser of the confocal microscope.

It is useful that the minimum of the diameter d of the opening of the sacrificial layer be equal to or larger than the wavelength of a laser beam and equal to or smaller than the diameter of the pilot hole. Additionally, when the distance between the optically conjugate image of the pinhole formed inside the substrate through the condenser 66 and the sacrificial layer is "a" and the F number Fno determined by the focal length f of the condenser 66 and the efficient diameter D is defined as f/D, the optimal value of the diameter d of the opening of the sacrificial layer is a/Fno. With such a configuration, the opening of the nontransparent sacrificial layer acts as "aperture" for preventing an unnecessary laser beam from entering the confocal microscope. The resolving power of the confocal microscope can be improved by an appropriate size of the opening. Accordingly, the precision of measurement of the depth of processing can be enhanced, and a pilot hole can be formed with higher depth precision.

The opening typically performs the function corresponding to an aperture of a condenser optical system. Thus if the diameter of the opening is small, the resolution increases, but the sensitivity reduces. Even if the diameter d of the opening significantly exceeds the value of a/Fno, the confocal microscope operates; however, a large quantity of diffused light of a laser beam moving on the laser processing surface with a high speed may enter the photodetector as an optical noise component, and this may cause a reduction in resolution or saturation of light intensity.

Embodiments of the present invention are illustrated with reference to the drawings, and a method of manufacturing a liquid ejection head according to the embodiments of the present invention is described. In the following description, as an example of application of the present invention, an ink jet recording head is described. However, a range in which the present invention is applicable is not limited to the ink jet recording head. The present invention is also applicable to a liquid ejection head for use in production of a bio chip and printing of an electronic circuit. Aside from the ink jet recording head, a head for use in color filter production can be one example of the liquid ejection head.

First Embodiment

A first embodiment of the present invention is described in detail below. However, the present invention is not limited to the embodiment described below.

FIGS. 4A to 4H illustrate in cross section how an ink channel is formed by a manufacturing method according to the embodiment of the present invention.

Figure 4A:
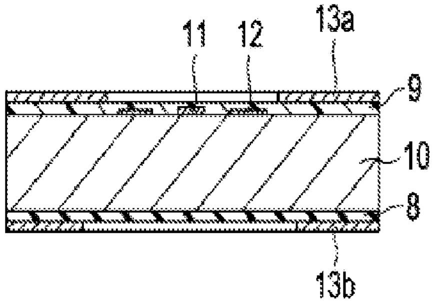
FIGS. 4A to 4H are illustrations for use in describing a process of a method of manufacturing an ink jet recording head according to a first embodiment.
Figure 4B:
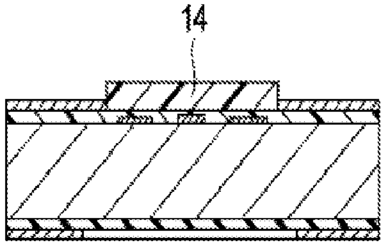

In FIG. 4A, an ejection energy generating element 11 is formed on a substrate 10. A sacrificial layer 12 is also formed on the substrate 10. A passivation film 9 (also referred to as membrane film) is formed on the substrate 10, the ejection energy generating element 11, and the sacrificial layer 12. An adhesion enhancing layer 13*a* is formed on the passivation film 9. A thermal oxidation film 8 is deposited over the back side of the substrate 10. A pattern of an etching mask 13*b* is formed on the thermal oxidation film 8.

A material removal by etching liquid in anisotropic etching may be used in the sacrificial layer 12. Examples of that material include aluminum, aluminum silicon (Al/Si), aluminum copper (Al/Cu), and aluminum silicon copper (Al/Si/Cu). One example material used in a sacrificial layer that allows a laser beam to be transmitted therethrough can be polysilicon. The provision of the sacrificial layer enables a liquid supply port to be formed precisely.

A P—SiO/P—SiN film can be used in the passivation film 9, for example.

One example material used in the adhesion enhancing layer 13*a* can be HIMAL (brand name from Hitachi Chemical Co., Ltd.). The pattern of the adhesion enhancing layer 13*a* can be formed by a photolithography process. HIMAL (brand name from Hitachi Chemical Co., Ltd.) can also be used in the etching mask 13*b*, for example. The pattern of the etching mask 13*b* can also be formed by a photolithography process.

Next, a positive resist layer 14 serving as the mold material of an ink channel is formed on the substrate illustrated in FIG. 4A using polymethyl isopropenyl ketone (PMIPK). A coating-type resist having PMIPK as the main ingredient is commercially available under the brand name "ODUR-1010" from Tokyo Ohka Kogyo Co., Ltd. This coating can be formed by general-purpose spin coating. Exposing the positive resist layer 14 with exposure light having a wavelength of, for example, approximately 230 nm to 350 nm and developing it forms the pattern illustrated in FIG. 4B.

Figure 4C:
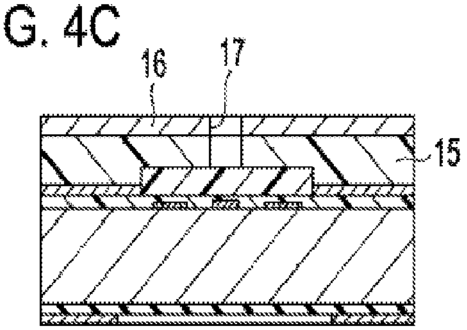

Next, as illustrated in FIG. 4C, a liquid channel structure material is applied so as to cover the positive resist layer 14 to form a resin coating layer (also referred to as channel forming layer) 15. One example of a material used in the liquid channel structure material to be applied can be a photosensitive material mainly containing epoxy resin described in Japanese Patent No. 3,143,307. When this photosensitive material dissolved in an aromatic solvent, such as xylene, is applied, compatibility with PMIPK can be prevented. Additionally, an ejection orifice 17 is formed in the resin coating layer 15 by exposure and development. Typically, a material having negative characteristics is used as the liquid channel structure material. Accordingly, a photomask (not illustrated) that prohibits a section in which an ejection orifice is to be formed from being irradiated with light is employed.

If a water-repellent coating 16 is formed on the channel forming layer 15, as described in Japanese Patent Laid-Open No. 2000-326515, the ejection orifice 17 can be formed by forming a photosensitive water-repellent material layer and collectively performing exposure and development on that layer and the channel forming layer. At this time, the water-repellent coating 16 having photosensitivity can be formed by lamination. After that, the channel forming layer 15 and the water-repellent coating 16 having photosensitivity are exposed at the same time. It is useful that an aromatic solvent, such as xylene, be used in development.

Figure 4D:
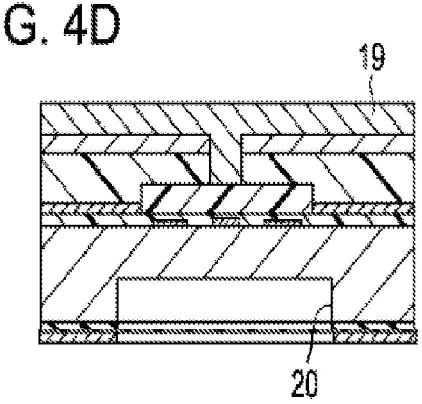

Next, as illustrated in FIG. 4D, in order to protect the channel forming layer 15 from an alkaline solvent, cyclized isoprene is applied on the channel forming layer 15, for example, to form a protective layer 19. One example of the cyclized isoprene is launched under the brand name "OBC" from Tokyo Ohka Kogyo Co., Ltd. After that, the substrate 10 and the thermal oxidation film 8, which is disposed on the back side of the substrate 10, are simultaneously processed by use of a laser processing machine, and a common ink supply port 20 is thus formed. At this time, the distance from the back side of the substrate 10 to the flat surface of the common ink supply port 20 can be approximately 500 μm, for example. The used substrate can have a thickness of approximately 625 μm and be approximately 6-inch size (ϕ 150 mm), for example.

Figure 4E:
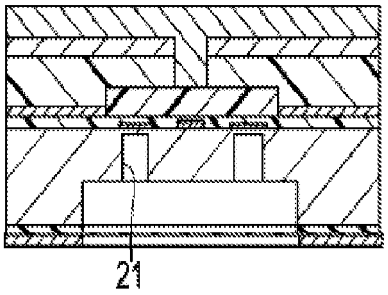

Next, as illustrated in FIG. 4E, a pilot hole is formed by use of a laser processing machine described below according to the present embodiment while the depth of processing is detected from the front surface of the substrate (recognizable as the front surface of the resin layer). The pilot hole can be formed by laser beam scanning, for example. The pilot hole can be formed so as to have a depth of approximately 120 to approximately 124 μm (the thickness of the remaining substrate: approximately 1 to approximately 5 μm).

Figure 4F:
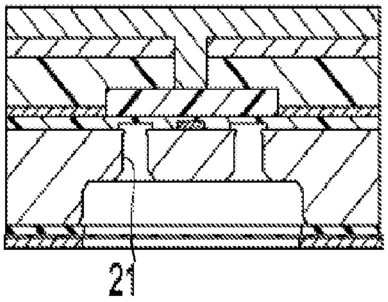

Next, as illustrated in FIG. 4F, the silicon substrate is subjected to anisotropic etching to form a liquid supply port. One example of etching liquid used in the anisotropic etching can be an alkaline solution, for example. The etching can be performed by immersion in tetramethylammonium hydroxide (TMAH), for example, approximately 22 wt % solution, at approximately 83° C. for approximately 2 to approximately 10 min. The sacrificial layer 12 on the front surface of the substrate is removed together with the silicon substrate by the above-described anisotropic etching. After that, the thermal oxidation film 8 and the etching mask 13*b* on the back surface of the substrate 10 are removed.

Figure 4G:
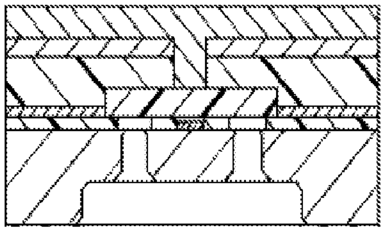

Next, as illustrated in FIG. 4G, the passivation film 9 formed on the sacrificial layer 12 is removed.

Figure 4H:
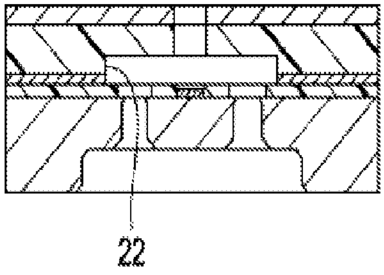

Finally, as illustrated in FIG. 4H, the substrate is immersed in a solution, for example, xylene, and the protective layer 19 is removed. After that, the positive resist layer 14, which is the mold material of the liquid channel, is decomposed by exposure on the entire surface. For example, irradiation with light having a wavelength of 330 nm or below cracks the resist material into low molecular weight compounds, which are easier to be removed by a solvent. Through this process, as illustrated in the cross-sectional view of FIG. 4H, an ink channel 22 linking the ink supply port and the ejection orifice is formed.

Figure 5:
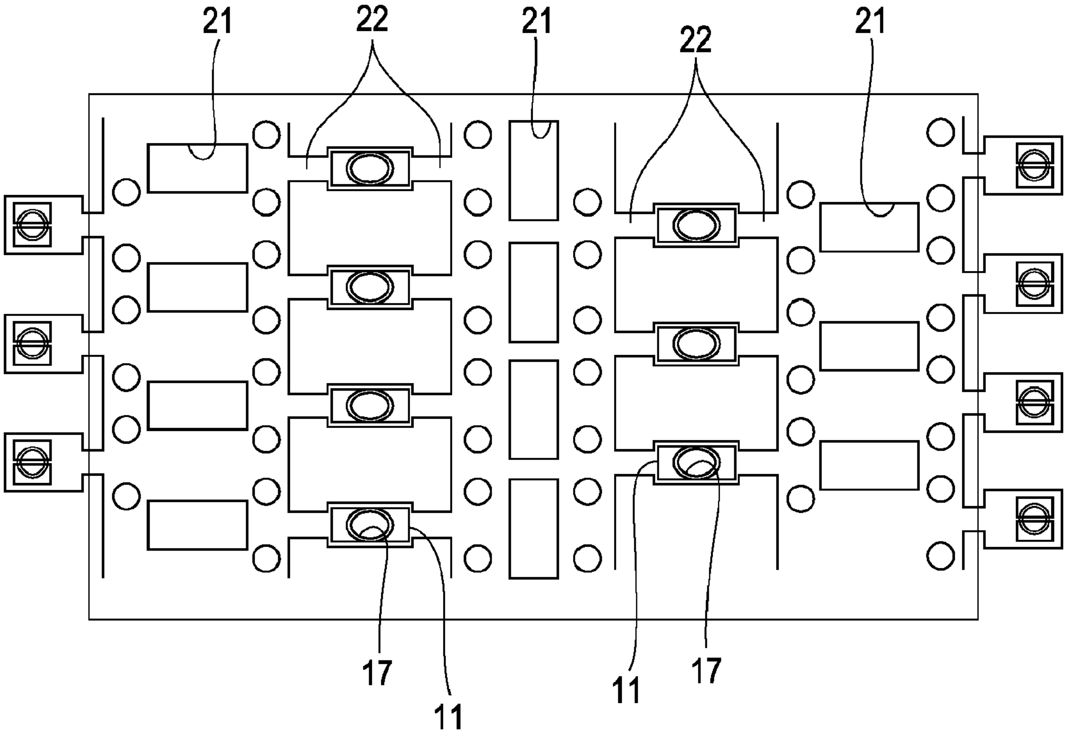
FIG. 5 is a top view that illustrates arrangement of nozzles of an ink jet recording head according to the first embodiment.

FIG. 5 is a top view of a single-color nozzle arrangement forming an ink jet recording head in which the ink channels (liquid channels) 22 are symmetrically disposed with respect to the ejection energy generating elements 11. The ejection energy generating element 11 and the ink channel 22 symmetrically disposed with respect to the ejection energy generating element 11 are disposed between a central independent ink supply port 21 and each of independent ink supply ports 21 disposed at both sides thereof. With this arrangement, the ejection energy generating element 11 is filled with ink supplied from the independent ink supply ports 21 at both sides through the symmetrical ink channel 22. The independent ink supply ports 21 are linked to the common ink supply port 20 arranged at the back surface side of the substrate.

Figure 8:
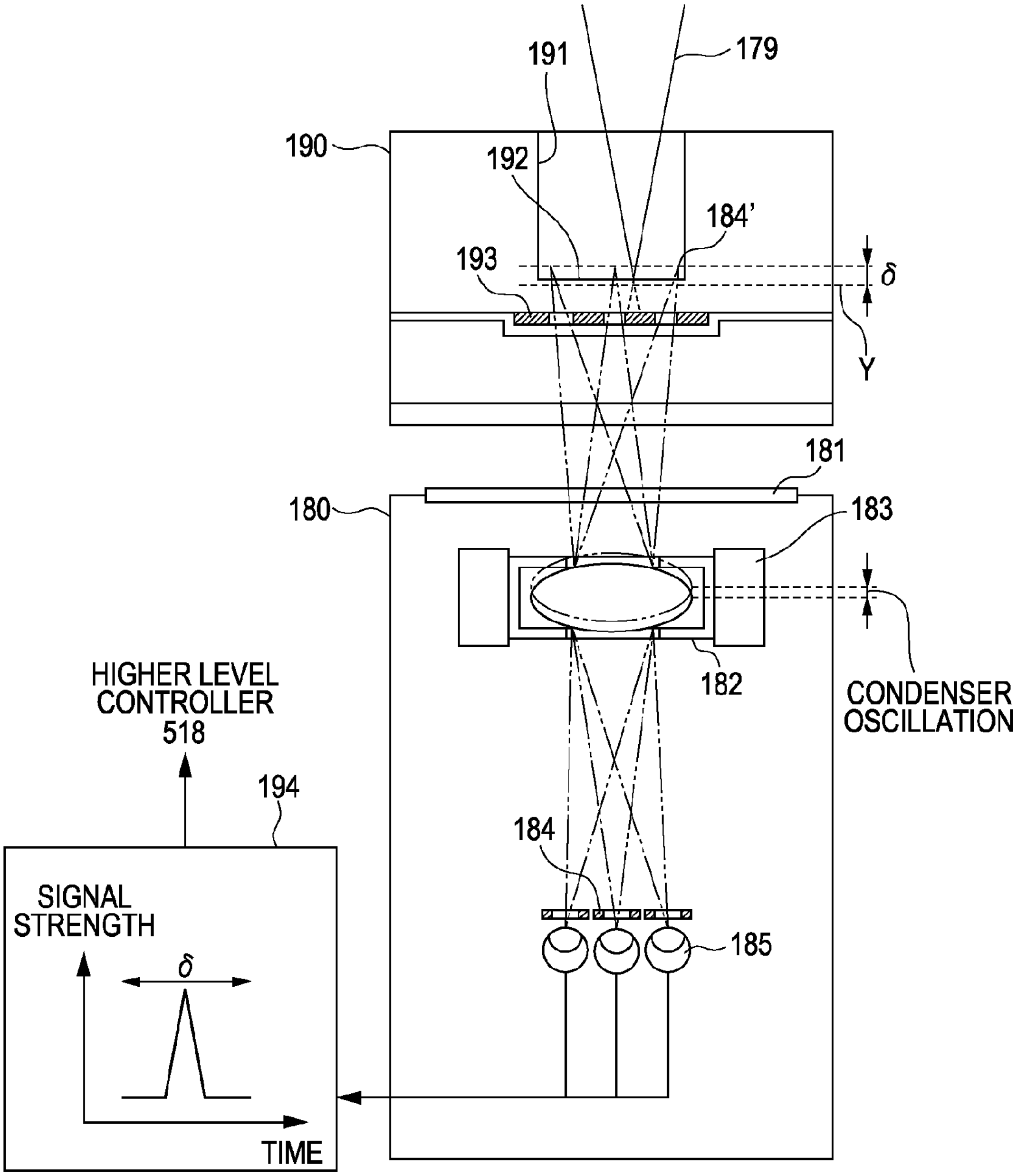
FIG. 8 is a diagram for use in describing a unit configured to detect the depth of laser processing according to the first embodiment.

FIG. 8 illustrates a configuration for detecting the position (depth) of laser processing using a confocal microscope according to the present embodiment.

Reference numeral 180 indicates a confocal microscope. A transparent window 181 is transparent to a laser beam 179. An actuator 183 moves a condenser 182 in the direction of its optical axis. Reference numeral 184 indicates a pinhole section. Photodetectors 185 have sensitivity to the wavelength of the laser beam 179. A substrate 190 includes an ejection energy generating element and can be a silicon substrate, for example. A sacrificial layer 193 is disposed on the front surface (at a first surface corresponding to the lower part in FIG. 8) of the substrate 190. The sacrificial layer 193 includes a resin layer, such as an adhesion enhancing layer and a channel forming layer, and has openings. The laser beam 179 is a diode-pumped solid-state laser with a wavelength of 1,064 nm translucent to the substrate 190. Reference numeral 191 indicates a partially or fully formed pilot hole (also referred to as laser processing region). Reference numeral 192 indicates a forefront surface (also referred to as laser processing surface) of the pilot hole 191. The sacrificial layer 193 has three openings allowing a laser beam to be transmitted therethrough and is made of an aluminum silicon (Al/Si) film that is nontransparent to the laser beam 179. A signal processing controller 194 processes signals from the photodetectors 185. The pinhole section 184 can be a component in which a minute puncture is formed in a metal thin plate, and a gold thin film highly reflective to the wavelength of the laser beam 179 is deposited thereon to prevent damage caused by the laser beam 179. The diameter of the pinhole can be at or below approximately one-third the expanse of a condensed laser beam by diffraction. The intensity of light obtainable decreases with a reduction in the diameter of the pinhole. Thus the diameter of the pinhole is determined in consideration of balance with the sensitivity of the photodetector. For the present embodiment, it can be on the order of 5 μm, for example.

Figure 9:
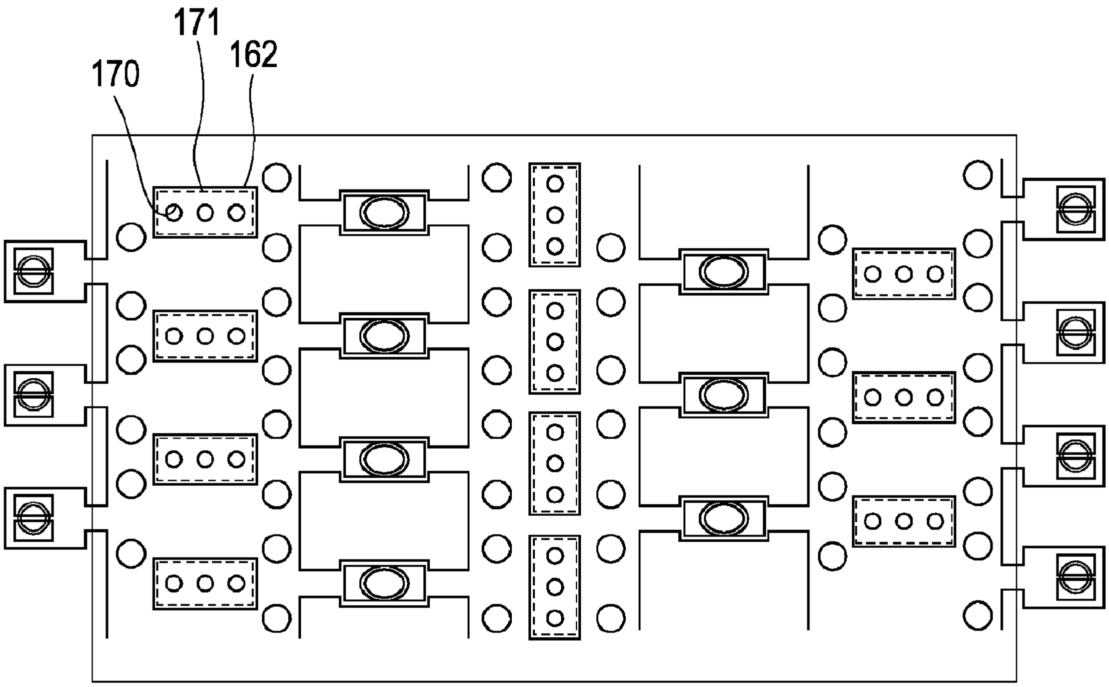
FIG. 9 is a top view that illustrates a sacrificial layer having openings according to the first embodiment in a manner in which its inside is seen.

FIG. 9 is a top view of the sacrificial layer having openings. To simplify the description, the sacrificial layer is illustrated in FIG. 9 such that its inside is seen. An aluminum silicon (Al/Si) film sacrificial layer 162 has openings 170. Each of the openings 170 is disposed within the laser processing region. Reference numeral 171 indicates an outline of the laser processing region. For the present embodiment, the diameter of the opening 170 can be approximately 10 μm, for example.

Next, operations in the above configuration are described in sequence. Laser processing is advanced by condensation of the laser beam 179 on the substrate 190, and the pilot hole 191 is formed. The laser processing surface 192, which is the bottom of the pilot hole 191, progresses downward (in the direction of the front surface of the substrate) over time of processing. Here, the position Y (see FIG. 8) is a desired processing stop position. The laser beam 179 having passed through the openings in the sacrificial layer 193 enters the photodetectors 185 through the transparent window 181, the condenser 182, and the pinhole section 184.

Principles of signal processing are described below. The pinholes in the pinhole section 184 form optically conjugate images in the substrate 190 through the condenser 182. For the present embodiment, the three pinholes of the pinhole section 184 form their respective conjugate images 184'. Then, the signal processing controller 194 inputs a driving signal that has a constant frequency and amplitude into the actuator 183 to drive the condenser 182 in the direction of the optical axis. As a result, the conjugate images 184' reciprocate (oscillate) within the range δ. For the present embodiment, for example, a triangular wave is used in the driving signal, and the conjugate images 184' can be caused to reciprocate with a frequency of approximately 100 Hz and an amplitude of approximately 50 μm. A piezoelectric element can be used in the actuator 183, for example. A voice coil, an ultrasonic motor, and other electrical, magnetic, and mechanical driving units can also be used.

Laser processing advances while the laser beam 179 moves on the laser processing surface 192 with a high speed. Part of the laser beam 179 passes through the substrate 190 and is diffused into a direction opposite to an incidence side. The diffused light passes through the openings in the sacrificial layer 193 and is condensed by the condenser 182. When the laser processing progresses and the laser processing surface 192 reaches the movable range δ, at the point in time when the laser processing surface 192 and the position of each of the conjugate images 184' match each other, the intensity of light passing through the center of the pinhole is at a maximum. Averaging electric signals from the three photodetectors 185, detecting the time when the signal is at a maximum, and stopping the laser oscillator enables the laser processing to be stopped at a specific position within the range δ with high precision.

With such a configuration, the use of pinholes disposed at different positions can detect different laser processing positions. Accordingly, appropriately processing signals obtained from the pinholes enables the progress of the depth of laser processing to be measured with higher precision and also enables a pilot hole to be formed with higher depth precision.

For the present embodiment, the number of openings in the sacrificial layer and the number of pinholes corresponding to the openings are three. However, they can be set at any number depending on the dimensions of the processing portion or desired precision. The independent photodetectors used in the present embodiment may be other photo detectors, such as a charge-coupled device (CCD) or a positioning sensor diode, depending on the dimensions.

Second Embodiment

Figure 6:
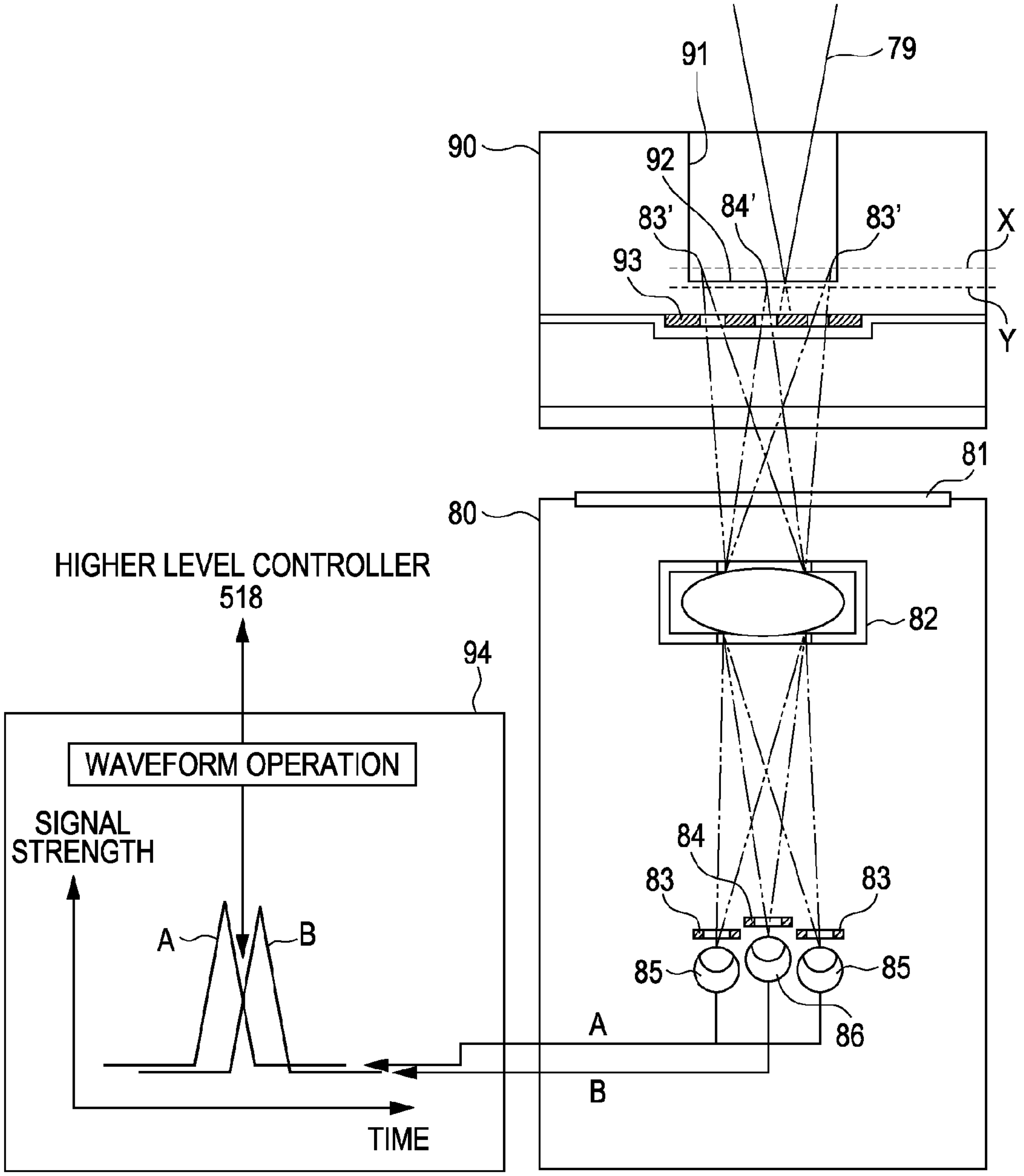
FIG. 6 is a diagram for use in describing a unit configured to detect the depth of laser processing according to a second embodiment.

FIG. 6 is a schematic diagram for use in describing a configuration of a confocal microscope according to a second embodiment. In FIG. 6, reference numeral 80 indicates a confocal microscope. A transparent window 81 is transparent to a laser beam 79. Reference numeral 82 indicates a condenser. Reference numerals 83 and 84 indicate pinhole sections. Photodetectors 85 and 86 have sensitivity to the wavelength of the laser beam 79. A substrate 90 includes an ejection energy generating element. A sacrificial layer 93 is disposed on the front surface (corresponding to the lower part in FIG. 6) of the substrate 90. The sacrificial layer 93 includes a resin layer, such as an adhesion enhancing layer and a channel forming layer, and has openings. The laser beam 79 is a diode-pumped solid-state laser with a wavelength of 1,064 nm translucent to the substrate 90. Reference numeral 91 indicates a partially or fully formed pilot hole (also referred to as laser processing region). Reference numeral 92 indicates a forefront surface (also referred to as laser processing surface) of the pilot hole 91. The sacrificial layer 93 has three openings allowing a laser beam to be transmitted therethrough and is made of an aluminum silicon (Al/Si) film that is nontransparent to the laser beam 79. A signal processing controller 94 processes signals from the photodetectors 85 and 86. Each of the pinhole sections 83 and 84 can be a component in which a minute puncture is formed in a metal thin plate, and a gold thin film highly reflective to the wavelength of the laser beam 79 is deposited thereon to prevent damage caused by the laser beam 79. The diameter of the pinhole can be at or below approximately one-third the expanse of a condensed laser beam by diffraction. The intensity of light obtainable decreases with a reduction in the diameter of the pinhole. Thus the diameter of the pinhole is determined in consideration of balance with the sensitivity of the photodetector. For the present embodiment, it is useful that the diameter be on the order of 5 μm, for example.

Next, laser processing activities in the above configuration are described in sequence. Laser processing is advanced by condensation of the laser beam 79 on the substrate 90, and the pilot hole 91 is formed. The laser processing surface 92, which is the bottom of the pilot hole 91, progresses downward (in the direction of the front surface of the substrate) over time of processing. The laser beam 79 having passed through the openings enters the photodetectors 85 and 86 through the transparent window 81, the condenser 82, and the pinhole sections 83 and 84.

Principles of signal processing are described below. The pinholes in the pinhole sections 83 and 84 form optically conjugate images in the substrate 90 through the condenser 82. For the present embodiment, the two pinholes in the pinhole section 83 form conjugate images 83' and the single pinhole in the pinhole section 84 forms a conjugate image 84'. Because the distance between the condenser 82 and the pinhole section 83 and the distance between the condenser 82 and the pinhole section 84 are different, the conjugate images 83' and 84' are formed at different positions X and Y. For the present embodiment, the interval between the positions X and Y can be set at approximately 50 μm, for example.

Laser processing advances while the laser beam 79 moves on the laser processing surface 92 with a high speed. Part of the laser beam 79 passes through the substrate 90 and is diffused into a direction opposite to an incidence side. The diffused light passes through the openings in the sacrificial layer 93 and is condensed by the condenser 82. When the laser processing progresses, at the point in time when the laser processing surface 92 and the position of each of the conjugate images 83' and 84' match each other, the intensity of light passing through the center of the pinhole is at a maximum. Accordingly, an output of each of the photodetectors 85 exhibits a waveform A illustrated in the signal processing controller 94 before and after the laser processing surface 92 passes through the position X as the progress of the laser processing. Similarly, an output of the photodetector 86 exhibits a waveform B illustrated in the signal processing controller 94 before and after the laser processing surface 92 passes through the position Y. Signal processing is performed using the waveforms A and B and outputs a trigger signal to the higher level controller 518 at the point in time when the waveforms A and B intersect. Immediately after receiving the trigger signal, the higher level controller 518 stops the oscillation of the laser oscillator. Accordingly, with the configuration according to the present embodiment, laser processing can be stopped between the positions X and Y with high precision.

For the present embodiment, the number of openings in the sacrificial layer and the number of pinholes corresponding to the openings are three. However, they can be set at any number depending on the dimensions of the processing portion or desired precision. The independent photodetectors used in the present embodiment may be other photo detectors, such as a CCD or a positioning sensor diode, depending on the dimensions.

Third Embodiment

Figure 7:
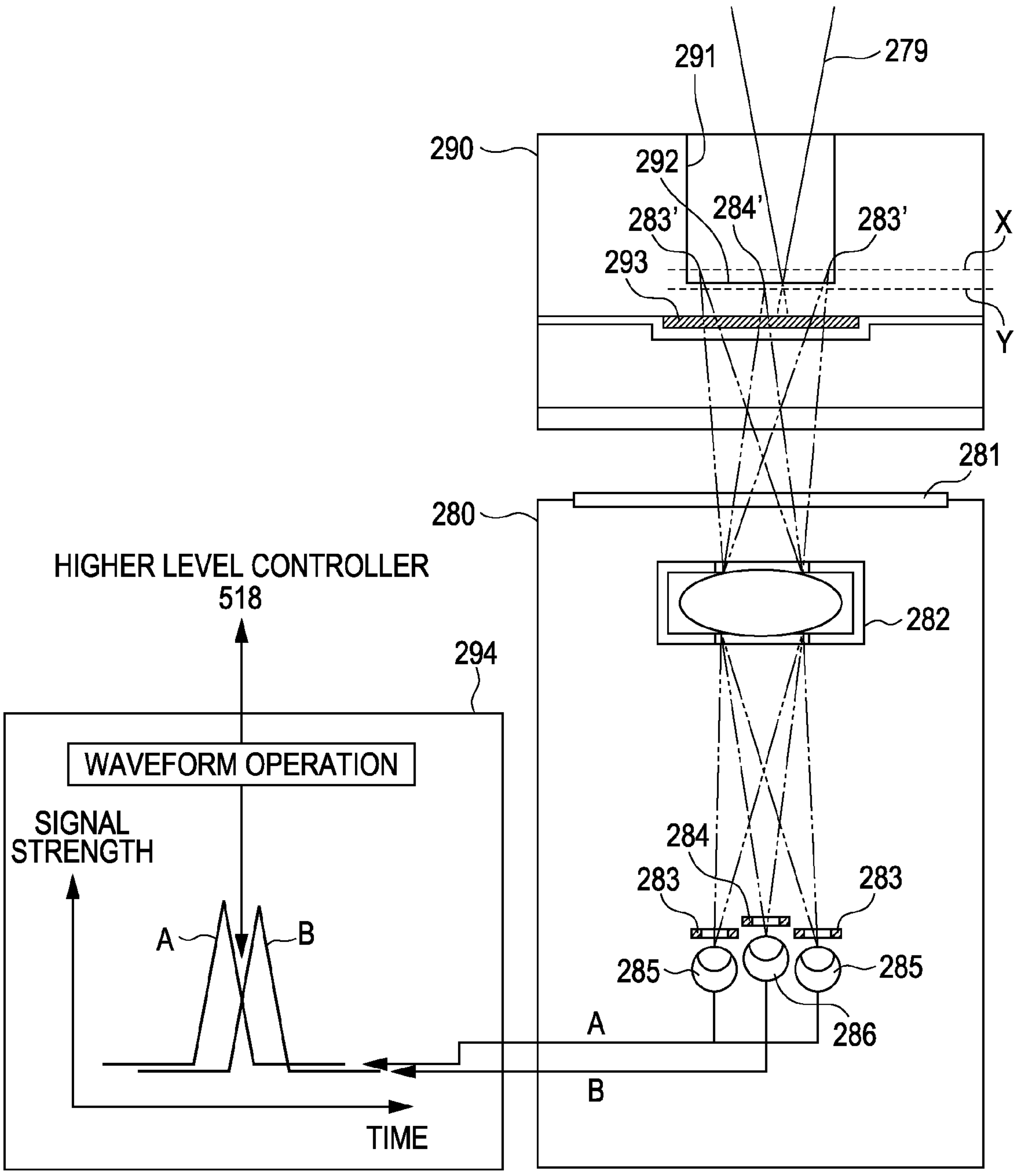
FIG. 7 is a diagram for use in describing a unit configured to detect the depth of laser processing according to a third embodiment.

FIG. 7 is a schematic diagram for describing a configuration of a confocal microscope according to a third embodiment. In FIG. 7, reference numeral 280 indicates a confocal microscope. A transparent window 281 is transparent to a laser beam 279. Reference numeral 282 indicates a condenser. Reference numerals 283 and 284 indicate pinhole sections. Photodetectors 285 and 286 have sensitivity to the wavelength of the laser beam 279. A substrate 290 includes an ejection energy generating element. A sacrificial layer 293 is disposed on the front surface (corresponding to the lower part in FIG. 7) of the substrate 290. The sacrificial layer 293 includes a resin layer, such as an adhesion enhancing layer and a channel forming layer, and has openings. The laser beam 279 is a diode-pumped solid-state laser with a wavelength of 1,064 nm translucent to the substrate 290. Reference numeral 291 indicates a partially or fully formed pilot hole (also referred to as laser processing region). Reference numeral 292 indicates a forefront surface (also referred to as laser processing surface) of the pilot hole 291. The sacrificial layer 293 is made of a film that allows the laser beam 279 to be transmitted therethrough, and it can be made of polysilicon film, for example. A signal processing controller 294 processes signals from the photodetectors 285 and 286. Each of the pinhole sections 283 and 284 can be a component in which a minute puncture is formed in a metal thin plate, and a gold thin film highly reflective to the wavelength of the laser beam 279 is deposited thereon to prevent damage caused by the laser beam 279. The diameter of the pinhole can be at or below approximately one-third the expanse of a condensed laser beam by diffraction. The intensity of light obtainable decreases with a reduction in the diameter of the pinhole. Thus the diameter of the pinhole is determined in consideration of balance with the sensitivity of the photodetector. For the present embodiment, it is useful that the diameter be on the order of 5 μm, for example.

Next, laser processing activities in the above configuration are described in sequence. Laser processing is advanced by condensation of the laser beam 279 on the substrate 290, and the pilot hole 291 is formed. The laser processing surface 292 in the pilot hole 291 progresses downward (in the direction of the front surface of the substrate) over time of processing. The laser beam 279 having passed through the sacrificial layer 293 enters the photodetectors 285 and 286 through the transparent window 281, the condenser 282, and the pinhole sections 283 and 284.

Principles of signal processing are described below. The pinholes in the pinhole sections 283 and 284 form optically conjugate images in the substrate 290 through the condenser 282. For the present embodiment, the two pinholes in the pinhole section 283 form conjugate images 283' and the single pinhole in the pinhole section 284 forms a conjugate image 284'. Because the distance between the condenser 282 and the pinhole section 283 and the distance between the condenser 282 and the pinhole section 284 are different, the conjugate images 283' and 284' are formed at different positions X and Y. For the present embodiment, the interval between the positions X and Y is set at approximately 50 μm, for example.

Laser processing advances while the laser beam 279 moves on the laser processing surface 292 with a high speed. Part of the laser beam 279 passes through the substrate 290 and is diffused into a direction opposite to an incidence side. The diffused light passes through the sacrificial layer 293 and is condensed by the condenser 282. When the laser processing progresses, at the point in time when the laser processing surface 292 and the position of each of the conjugate images 283' and 284' match each other, the intensity of light passing through the center of the pinhole is at a maximum. Accordingly, an output of each of the photodetectors 285 exhibits a waveform A illustrated in the signal processing controller 294 before and after the laser processing surface 292 passes through the position X as the progress of the laser processing. Similarly, an output of the photodetector 286 exhibits a waveform B illustrated in the signal processing controller 294 before and after the laser processing surface 292 passes through the position Y. Signal processing is performed using the waveforms A and B and outputs a trigger signal to the higher level controller 518 at the point in time when the waveforms A and B intersect. Immediately after receiving the trigger signal, the higher level controller 518 stops the oscillation of the laser oscillator. Accordingly, with the configuration according to the present embodiment, laser processing can be stopped between the positions X and Y with high precision.

For the present embodiment, the number of pinholes is three. However, that number can be set at any number depending on the dimensions of the processing portion or desired precision. The independent photodetectors used in the present embodiment may be other photo detectors, such as a CCD or a positioning sensor diode, depending on the dimensions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-218924 filed Sep. 24, 2009, which is hereby incorporated by reference herein in its entirety.

What is claimed is:

1. A method of processing a substrate, the method comprising:

preparing a substrate, a first mask disposed adjacent to a first surface of the substrate, a condenser disposed adjacent to the first surface of the substrate, a second mask including a second light transmitting portion, and a photo detecting member including a photo detecting portion, wherein the first mask includes a first light transmitting portion that allows light to be transmitted therethrough, the condenser is configured to condense light that has passed through the first light transmitting portion toward the second light transmitting portion, the second light transmitting portion allows the light condensed by the condenser to be transmitted therethrough, and the photo detecting portion is configured to detect light that has passed through the second light transmitting portion; and forming a recess in the substrate by irradiation of a laser beam from a direction opposite to the first surface of the substrate, wherein the laser beam is detected by the photo detecting portion, and when an intensity of the laser beam detected by the photo detecting portion is equal to or larger than a specific intensity, the irradiation of the laser beam is stopped.

2. The method according to claim 1, wherein the first mask is in contact with the substrate.

3. The method according to claim 1, wherein a center of the first light transmitting portion is arranged on an optical axis linking a center of the second light transmitting portion and a center of an optically conjugate image of the second light transmitting portion, the optically conjugate image being formed in the substrate through the condenser.

4. The method according to claim 1, wherein the recess has a substantially circular cross-sectional shape, and the first light transmitting portion has a diameter equal to or larger than a wavelength of the laser beam and equal to or smaller than a diameter of the recess.

5. A method of processing a substrate, the method comprising:

preparing a substrate, a first mask disposed adjacent to a first surface of the substrate, a condenser disposed adjacent to the first surface of the substrate, a plurality of second masks each including a second light transmitting portion, and a photo detecting member including photo detecting portions corresponding to the respective second masks, wherein the first mask includes a plurality of first light transmitting portions that allow light to be transmitted therethrough, the condenser is configured to condense light that has passed through the first light transmitting portions toward the second light transmitting portions, the second light transmitting portions allow the light condensed by the condenser to be transmitted therethrough, and the photo detecting portions are configured to detect light that has passed through the second light transmitting portions; and forming a recess in the substrate by irradiation of a laser beam from a direction opposite to the first surface of the substrate, wherein the condenser is caused to oscillate in a direction of an optical axis thereof, and when a mean value of intensities of the laser beam detected by the photo detecting portions after passing through the second light transmitting portions reaches a maximum, the irradiation of the laser beam is stopped.

6. The method according to claim 5, wherein a distance between one second mask of the plurality of second masks and the substrate is different from a distance between at least one of the other second masks and the substrate.

7. A method of manufacturing a substrate for use in a liquid ejection head, the method comprising:

preparing a substrate including an energy generating element and a first mask that are disposed at a first surface thereof, a condenser disposed adjacent to the first surface of the substrate, a second mask including a second light transmitting portion, and a photo detecting member including a photo detecting portion, wherein the energy generating element is configured to generate energy for use in ejecting liquid, the first mask includes a first light transmitting portion that allows light to be transmitted therethrough, the condenser is configured to condense light that has passed through the first light transmitting portion toward the second light transmitting portion, the second light transmitting portion allows the light condensed by the condenser to be transmitted therethrough, and the photo detecting portion is configured to detect light that has passed through the second light transmitting portion; and forming a recess in the substrate by irradiation of a laser beam from a direction opposite to the first surface of the substrate, wherein the laser beam is detected by the photo detecting portion, and when an intensity of the laser beam detected by the photo detecting portion is equal to or larger than a specific intensity, the irradiation of the laser beam is stopped.

8. The method according to claim 7, wherein a center of the first light transmitting portion is arranged on an optical axis linking a center of the second light transmitting portion and a center of an optically conjugate image of the second light transmitting portion, the optically conjugate image being formed in the substrate through the condenser.

9. The method according to claim 7, wherein the recess has a substantially circular cross-sectional shape, and the first light transmitting portion has a diameter equal to or larger than a wavelength of the laser beam and equal to or smaller than a diameter of the recess.

10. The method according to claim 7, wherein the first mask is made of aluminum, and the laser beam has a wavelength in an infrared region, the method further comprising:

after the irradiation of the laser beam is stopped, wet-etching the substrate through the recess such that an etching region reaches the first mask;

removing the first mask by etching such that the substrate is penetrated; and forming a liquid supply channel in the substrate, the liquid supply channel being for use in supplying liquid to the energy generating element.

11. A method of manufacturing a substrate for use in a liquid ejection head, the method comprising:

preparing a substrate including an energy generating element and a first mask that are disposed at a first surface thereof, a condenser disposed adjacent to the first surface of the substrate, a plurality of second masks each including a second light transmitting portion, and a photo detecting member including photo detecting portions corresponding to the respective second masks, wherein the energy generating element is configured to generate energy for use in ejecting liquid, the first mask includes a first light transmitting portion that allows light to be transmitted therethrough, the condenser is configured to condense light that has passed through the first light transmitting portion toward the second light transmitting portions, the second light transmitting portions allow the light condensed by the condenser to be transmitted therethrough, and the photo detecting portions are configured to detect light that has passed through the second light transmitting portions; and forming a recess in the substrate by irradiation of a laser beam from a direction opposite to the first surface of the substrate, wherein the condenser is caused to oscillate in a direction of an optical axis thereof, and when a mean value of intensities of the laser beam detected by the photo detecting portions after passing through the second light transmitting portions reaches a maximum, the irradiation of the laser beam is stopped.

12. The method according to claim 11, wherein a distance between one second mask of the plurality of second masks and the substrate is different from a distance between at least one of the other second masks and the substrate.

* * * * *